United States Patent
Val et al.

(10) Patent No.: US 9,659,846 B2
(45) Date of Patent: May 23, 2017

(54) PROCESS FOR MANUFACTURING A 3D ELECTRONIC MODULE COMPRISING EXTERNAL INTERCONNECTION LEADS

(71) Applicant: 3D PLUS, Buc (FR)

(72) Inventors: Alexandre Val, Le Chesnay (FR); Fabrice Soufflet, Bievres (FR)

(73) Assignee: 3D PLUS, Buc (FR)

( * ) Notice: Subject to any disclaimer, the term of this patent is extended or adjusted under 35 U.S.C. 154(b) by 0 days.

(21) Appl. No.: 15/046,277

(22) Filed: Feb. 17, 2016

(65) Prior Publication Data
US 2016/0247750 A1    Aug. 25, 2016

(30) Foreign Application Priority Data
Feb. 20, 2015 (FR) ..................................... 15 51445

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4825* (2013.01); *H01L 21/4842* (2013.01);
(Continued)

(58) Field of Classification Search
CPC ........... H01L 23/49575; H01L 23/3114; H01L 23/49503; H01L 21/565; H01L 21/568;
(Continued)

(56) References Cited

U.S. PATENT DOCUMENTS

| 4,996,587 | A | * | 2/1991 | Hinrichsmeyer | ....... | H01L 23/13 |
| | | | | | | 257/676 |
| 5,602,420 | A | * | 2/1997 | Ogata | ................... | H01L 25/105 |
| | | | | | | 257/623 |
| 2014/0210062 | A1 | * | 7/2014 | Miyazaki | ................ | H01L 21/56 |
| | | | | | | 257/676 |

FOREIGN PATENT DOCUMENTS

| FR | 1 487 033 A | 6/1967 |
| FR | 2 688 630 A1 | 9/1993 |
| WO | 01/59841 A1 | 8/2001 |

* cited by examiner

*Primary Examiner* — Karen Kusumakar
(74) *Attorney, Agent, or Firm* — Baker & Hostetler LLP

(57) ABSTRACT

A process for manufacturing at least one 3D electronic module each comprises a stack of electronic packages and/or printed wiring boards, wherein a stack is placed on an electrically interconnecting system comprising metal leads each having two ends. The process comprises the following steps: starting with a lead frame that comprises metal leads, folding by about 180° the leads in order to obtain what is referred to as an internal frame portion including the folded ends, which are intended to be molded, the other portion, which is what is referred to as an external portion, including the unfolded exterior ends, the two ends of each lead being intended to emerge from the 3D module on a given face cut along Z; depositing on the leads a metal coating; placing the external portion of the frame between two, an upper and lower, protective elements while leaving the internal portion free, and placing the frame and the protective elements on a carrier; placing each stack equipped each with exterior interconnection tabs so as to superpose the exterior tabs on the internal portion; molding, in a resin, the stack, the exterior tabs and the internal portion and thereby partially covering the upper protective element; cutting the resin and thereby leaving flush conductive sections of the exterior tabs and of the ends of the leads and removing the resin from the (Continued)

upper protective element; metallizing the cut faces; removing the carrier; and removing the protective elements in order to expose the leads of the external portion.

7 Claims, 7 Drawing Sheets

(51) Int. Cl.
    *H01L 25/10* (2006.01)
    *H01L 21/56* (2006.01)
    *H01L 23/31* (2006.01)

(52) U.S. Cl.
    CPC ........ *H01L 21/565* (2013.01); *H01L 23/3114* (2013.01); *H01L 23/49503* (2013.01); *H01L 23/49551* (2013.01); *H01L 23/49555* (2013.01); *H01L 25/105* (2013.01); *H01L 2225/1029* (2013.01); *H01L 2225/1064* (2013.01)

(58) Field of Classification Search
    CPC ........... H01L 21/4825; H01L 23/49548; H01L 21/4842; H01L 23/49555
    See application file for complete search history.

PROCESS FOR MANUFACTURING A 3D ELECTRONIC MODULE COMPRISING EXTERNAL INTERCONNECTION LEADS

CROSS-REFERENCE TO RELATED APPLICATION

This application claims priority to foreign French patent application No. FR 1551445, filed on Feb. 20, 2015, the disclosure of which is incorporated by reference in its entirety.

FIELD OF THE INVENTION

The field of the invention is that of 3D electronic modules and more particularly that of the external interconnection of these 3D modules. The production of present-day electronic systems, whether civil or military, must take into account requirements for increasingly high levels of compactness, because of the increasing number of circuits used.

BACKGROUND

In this search for greater compactness, it has already been proposed to produce stacks of packages encapsulating active or passive electronic components, such as described in French patents FR 2 688 630 and FR 2 805 082; the packages are interconnected three-dimensionally, the faces of the stack being used as interconnection surfaces to produce the connections between output leads of the packages. Specifically, a package encapsulating one or more electronic components also includes electrical connectors (wires or tracks for example) connecting the connection pads of the components to output leads that typically emerge on two opposite sides of the package. The process described in French patent FR 2 805 082 especially makes it possible to decrease the size of the 3D module in the plane of the packages, by cutting the unit through these packages rather than around the packages as was described in patent FR 2 688 630.

Encapsulating electronic components in plastic packages, such as for example standard packages of the SOJ (small outline J-lead), TSOP (thin small outline package) or CSP (chip scale package) type, has many advantages. Firstly, these packages have been tested and controlled for quality by the manufacturer whereas these operations are very difficult to carry out on bare chips. Moreover, it is generally difficult to obtain bare chips from manufacturers. The above reasons therefore mean that it is preferable to use packages, as it is clearly less expensive and easier. In the solutions of the aforementioned patents, the stacking of the packages involves the following main operations: possibly straightening the output leads in order to facilitate the centring and moulding; stacking the plastic packages; resin encapsulation and polymerization; cutting of the unit; metallization; and etching of the outlines of the connections on the faces of the unit.

The 3D module integrates a small outline package (SoP) conventionally including:

optionally a printed wiring board assembled with and electrically connected to, via a face, the stack of packages; and a lead frame formed from a metal layer (FeNiCo or FeNi or Cu alloys are widely used) apertured in its centre in order to receive the printed wiring board and including leads having each two ends. Ends of the leads are assembled with edges of the printed wiring board (on the face opposite that assembled with the stack). Once the 3D module has been manufactured, the other ends of the leads exit from the bottom of the 3D module and are generally formed with a view to subsequent assembly of the 3D module with a printed circuit board for example. The frame generally includes means for fastening the ends of the leads to each other in order to make it easier to form them.

Most 3D modules are equipped with such an SoP package.

Such a 3D module has a number of drawbacks. When the output leads are not formed and therefore exit in the direction of the stack (Z direction in the figures) in the form of vertical leads, the height of the 3D module is increased by as much, this running contrary to the sought compactness. In addition, automatic pick and place equipment is difficult to use during assembly on a printed circuit board because of the fragility of these vertical leads, and the solder joints used during the assembly cannot be effectively tested.

One solution therefore consists in forming the output leads (that exit below the module) by bending them to form gullwings for example. However, microcracks often appear in these bends thereby deteriorating the quality of their mechanical and electrical properties.

Therefore, there remains to this day a need for a process for manufacturing a 3D module that simultaneously satisfies all of the aforementioned requirements, in terms of electrical connection quality, ease of placement of the 3D module during its assembly on a board and of testing of the assembly.

SUMMARY OF THE INVENTION

The invention is based on a modification of the SoP. According to the most general aspect of the invention, the output leads of the SoP circuit exit on the faces on which the vertical interconnection specific to the process for manufacturing the 3D modules is located, and no longer from below.

More precisely, the process for manufacturing at least one 3D electronic module each comprising a stack in a Z direction of electronic packages and/or printed wiring boards, which stack is placed on a system for electrically interconnecting the 3D module with the exterior, comprising metal leads having ends, is mainly characterized in that it includes the following steps:

starting with a lead frame that comprises metal leads each having two ends, one toward the interior of the frame and the other toward the exterior of the frame, folding by about 180° the interior ends of the leads in order to obtain what is referred to as an internal frame portion including the folded ends, which are intended to be moulded, the other portion, which is what is referred to as an external portion, including the unfolded ends, the two ends of each lead being intended to emerge from the 3D module on a given face cut along Z;

depositing on the entire frame thus folded a metal coating compatible with subsequent steps of adhesive bonding and/or soldering of the external portion;

placing the external portion of the metallized frame between a lower protective element and an upper protective element while leaving the internal portion free, and placing this frame/protective elements assembly on a carrier;

placing each stack of packages and/or printed wiring boards equipped each with at least one electronic component and exterior tabs for electrically interconnecting packages and/or printed wiring boards, so as to superpose the exterior tabs on the internal portion;

moulding, in an epoxy resin, the stack and its exterior tabs and the internal portion and thereby partially covering the upper protective element;

cutting the resin along Z thereby leaving flush conductive sections of the exterior tabs and of the ends of the leads of the internal portion, and thereby forming faces cut along Z, and removing the resin from the upper protective element;

metallizing the cut faces presenting the conductive sections;

removing the carrier; and removing the protective elements in order to expose the leads of the external portion.

The 3D module thus obtained does not have weaknesses in the folded portion of the leads as they are metallized after they have been folded. It also makes it possible to more easily test the solder joints during the assembly on a printed circuit board because these joints are no longer hidden under the module, and makes it easier for automatic pick and place equipment to use the 3D module during assembly on a board.

The exposed leads of the external portion may be bent.

The metallized cut faces are etched to produce a vertical interconnection.

Preferably, a sealing element is placed between the protective elements during the placement of the external portion between these protective elements; it is removed during the removal of the protective elements.

According to one feature of the invention, the exterior tabs of the packages are present on four sides and the lead frame includes two subframes placed one on the other and perpendicular one relative to the other and each including leads, the leads of the first subframe being connected to two opposite faces of the stack, the leads of the second subframe being connected to the two other opposite faces of the stack.

According to another feature of the invention, the frame is a multiframe, for example comprising 5 frames.

Another subject of the invention is a 3D electronic module including:

a stack of packages and/or printed electronic wiring boards;

in the direction of the stack, interconnection faces for interconnection of the packages and/or printed wiring boards; and a system for connecting the 3D module to the exterior, comprising metal leads, characterized in that the two ends of each lead emerge from a given interconnection face.

BRIEF DESCRIPTION OF THE DRAWINGS

Other features and advantages of the invention will become apparent on reading the following detailed description, given by way of nonlimiting example and with reference to the appended drawings in which.

DETAILED DESCRIPTION

From one figure to another, the same elements are referenced by the same references.

In the rest of the description, the expressions "lower", "upper", "above", "below" and "vertical" are used with reference to the orientation of the described figures. Insofar as the device may be positioned with other orientations, the directional terminology is indicated by way of illustration and is nonlimiting.

The main steps of the manufacturing process according to the invention are the following.

Figure 1:
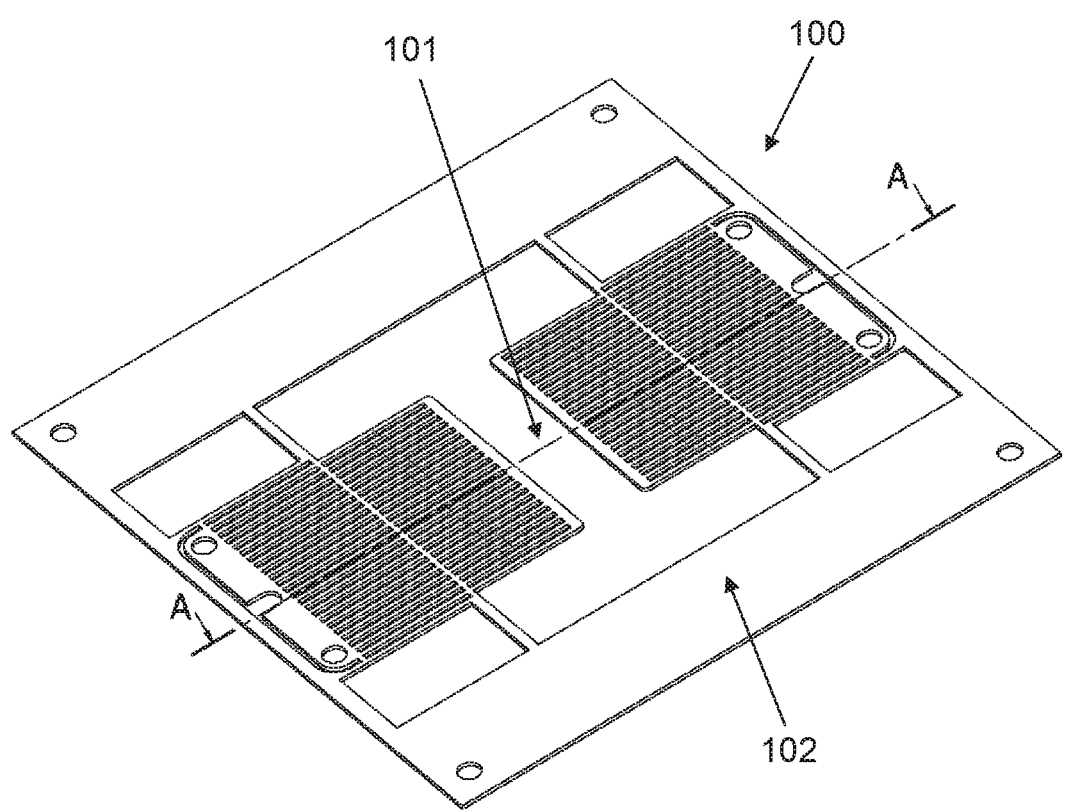
FIG. 1 schematically shows a perspective view of a lead frame according to the prior art.
Figure 2A:
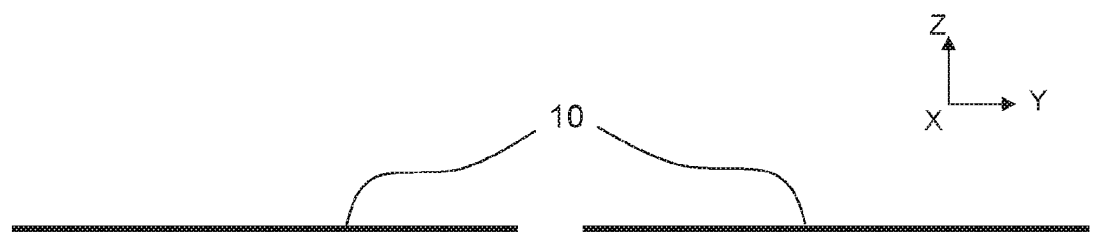
FIGS. 2a to 2i schematically illustrate the main steps of the process according to the invention, the views being shown in cross-section along the axis AA' in FIG. 1.
Figure 2B:
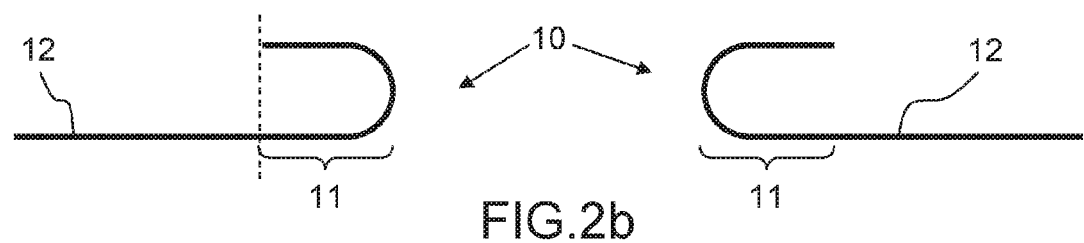
Figure 2C:
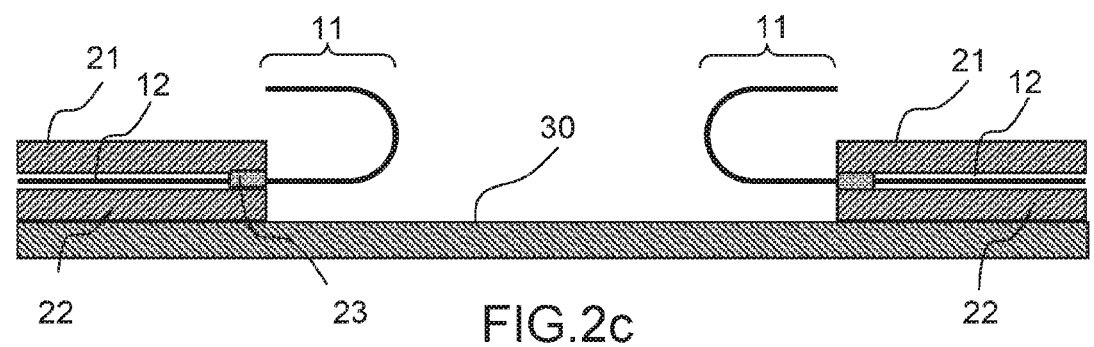
Figure 2D:
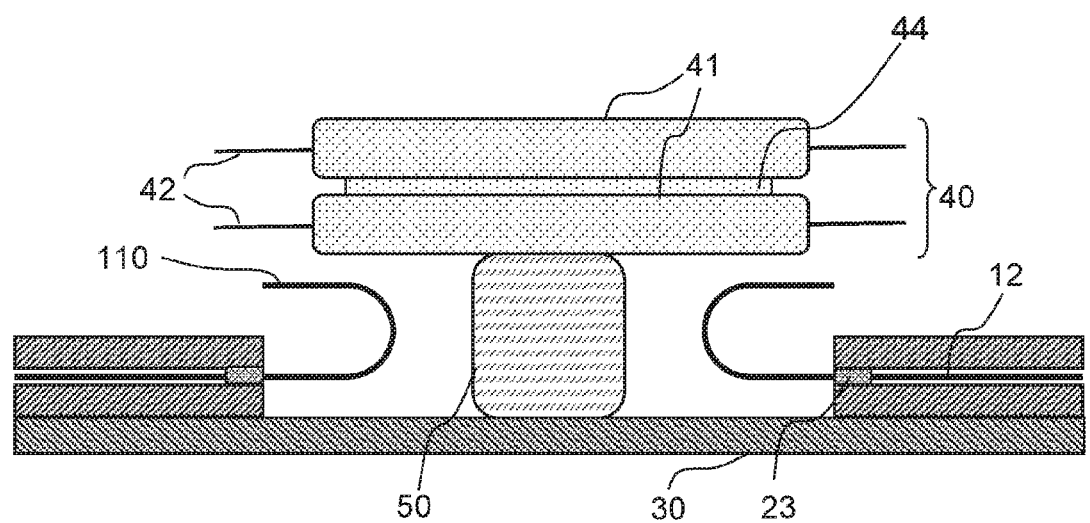
Figure 2E:
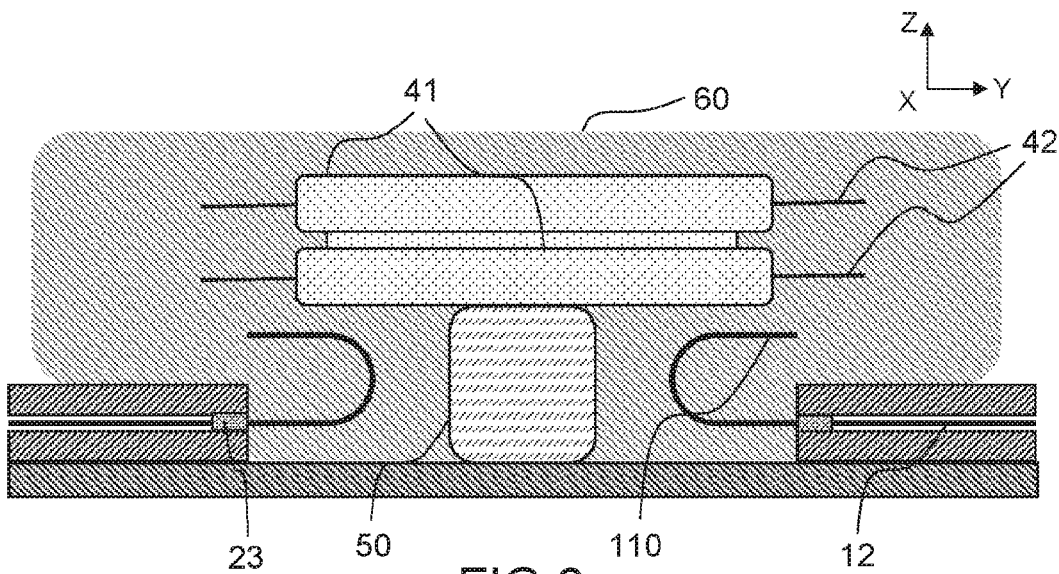
Figure 2F:
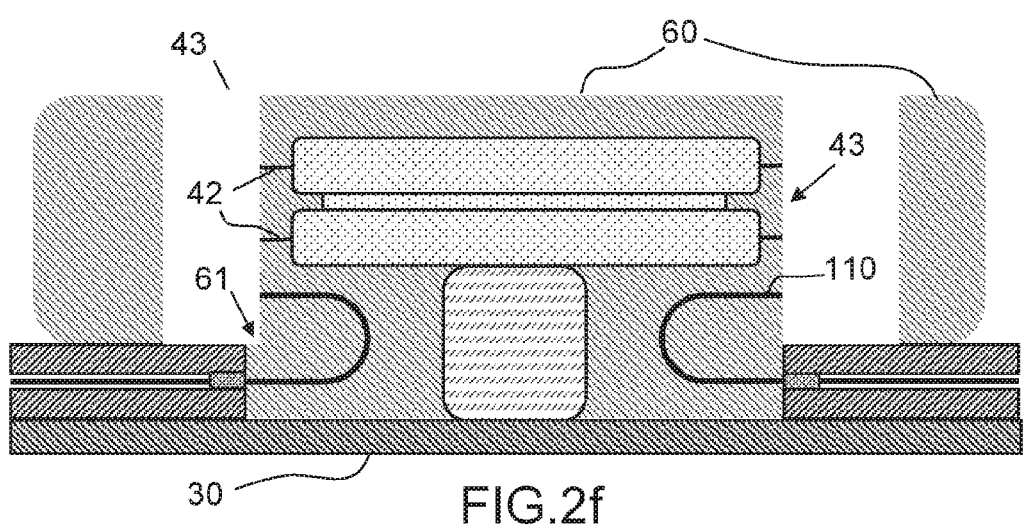
Figure 2G:
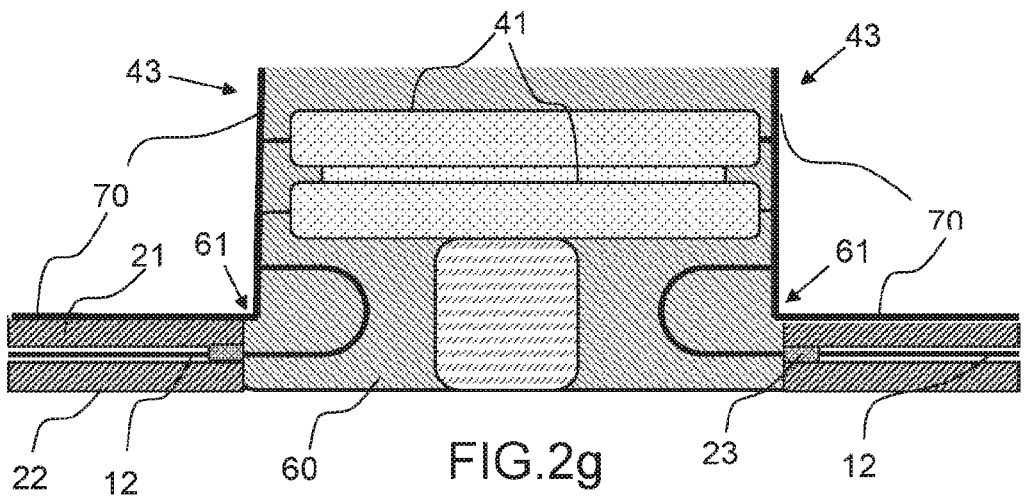
Figure 2H:
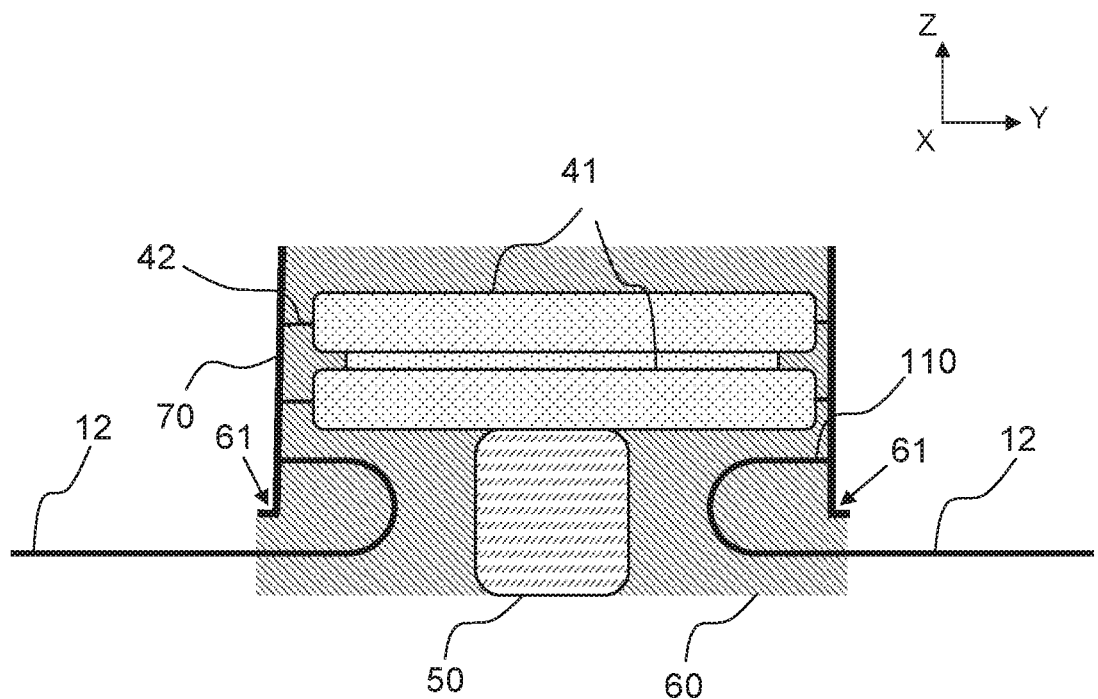

It comprises a step of preparing a lead frame 100, such as that shown in FIG. 1 in perspective and in FIG. 2a in cross section along AA', which comprises metal leads 10 each having two ends, one toward the interior of the frame, the other toward the exterior of the frame. This preparation consists in:

folding by about 180° the interior ends of the leads 10 of the frame 100 (FIG. 2b). The leads thus form a lain-down J as may be seen in the figures. It is then possible to define two portions in each lead 10 to which correspond two portions of the frame: a portion 11 including these folded ends that are intended to be moulded (designated portion to be moulded or internal portion), and a portion 12 that will not be moulded but protected (designated portion to be protected or external portion) and that will form the external leads of the 3D module, as will be seen below. The 3D dimensions of this internal portion 11 depend on the angle, and possibly on the radius of curvature and position (further from or closer to the end) of the fold, but they are defined so that the two ends 110 and 12 of each lead exit from the 3D module on a given vertical face 43 as will be seen below especially in FIGS. 2h and 2i; this is why a fold comprised between 135° and 180° may be envisioned but a fold of 180° is preferred as shown in the figures;

depositing on all the frame (portion 11 to be moulded and external portion 12) thus folded a metal coating compatible with subsequent steps of adhesive bonding and/or soldering of the external portion during the assembly of the 3D module to a printed circuit board; it is typically a question of a gold or nickel coating;

placing (FIG. 2c) the portion 12 of the metallized frame to be protected between a lower protective element 22 and an upper protective element 21, such as protective plates, while leaving free the internal portion to be moulded 11; these protective elements are typically made of metal or of ceramic or of polymers;

preferably placing a sealing element 23 between the two protective elements 21 and 22, in order to prevent in the moulding step moulding resin from penetrating between these protective elements;

and in placing this frame/protective elements assembly on a metal or ceramic or polymer carrier 30, the curved end of the internal portion of course being directed upward along Z (Z>0) as may be seen in the figures.

The frame thus being prepared, placing (FIG. 2d) at the centre 101 of the frame (see FIG. 1) a stack 40 of packages 41 and/or printed wiring boards (the stack preferably contains either packages or printed wiring boards but may optionally comprise both) optionally assembled with an adhesive 44 and each equipped with at least one electronic component (not shown in the figures), and exterior tabs 42 for electrical interconnection between packages and/or printed wiring boards, so as to superpose at least partially the exterior tabs 42 of the packages and/or printed wiring boards on the portion 11 to be moulded without deforming it; for this purpose, the stack 40 is for example placed on a paddle 50 made of metal, ceramic or polymer of preset height, this paddle possibly being placed on the carrier 30 at the centre of the frame as shown in the figure, or on the framing portion of the frame (framing portion 102 in FIG. 1) if the dimensions of the stack allow it;

moulding (FIG. 2e) in an epoxy resin 60 the stack 40 with its exterior tabs 42 and the portion to be moulded 11 of the frame, thereby partially covering the upper protective element 21;

cutting (FIG. 2f) the resin 60 along Z thereby leaving flush conductive sections of the exterior tabs 42 and the leads 110 of the moulded portion 11, without reaching the protected portion 12 of the leads, and while controlling this vertical cut so as preferably not to cut into the upper protective element 21. Depending on the position of the cutting axis, a resin shoulder 61 may remain on the upper protective element;

removing (FIG. 2g) the resin 60 covering the upper protective element 21;

metallizing, with a metal coating 70 consisting of a multilayer of conventional metals of copper and/or nickel and gold, the cut faces 43 comprising the conductive sections, this metallization here thus being carried out while the external portion 12 of the leads remains protected by the elements 21, 22; thus the upper protective element 21 is also metallized;

removing the carrier 30; this step may also be carried out before the metallization; and removing (FIG. 2h) the protective elements 21, 22 and the optional sealing element 23 in order to expose the external portion 12 of the leads and thus obtain the external leads 12 of the 3D module.

Figure 2I:
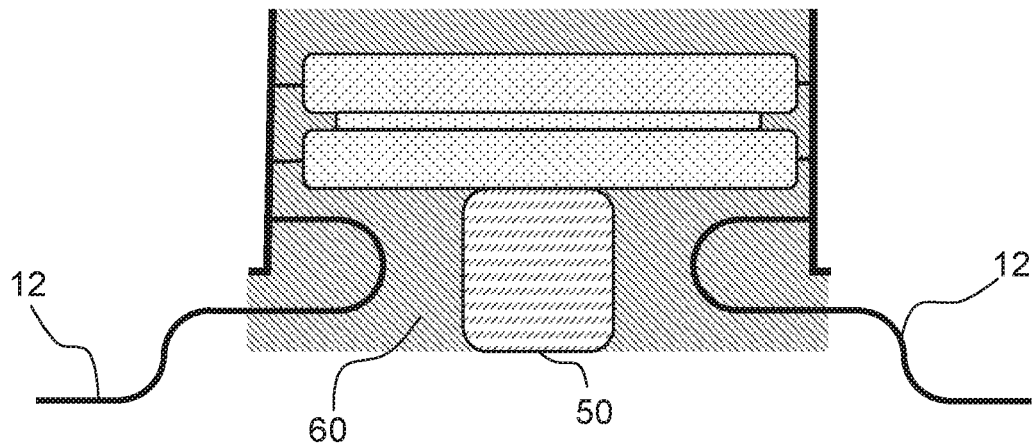
Figure 3A:
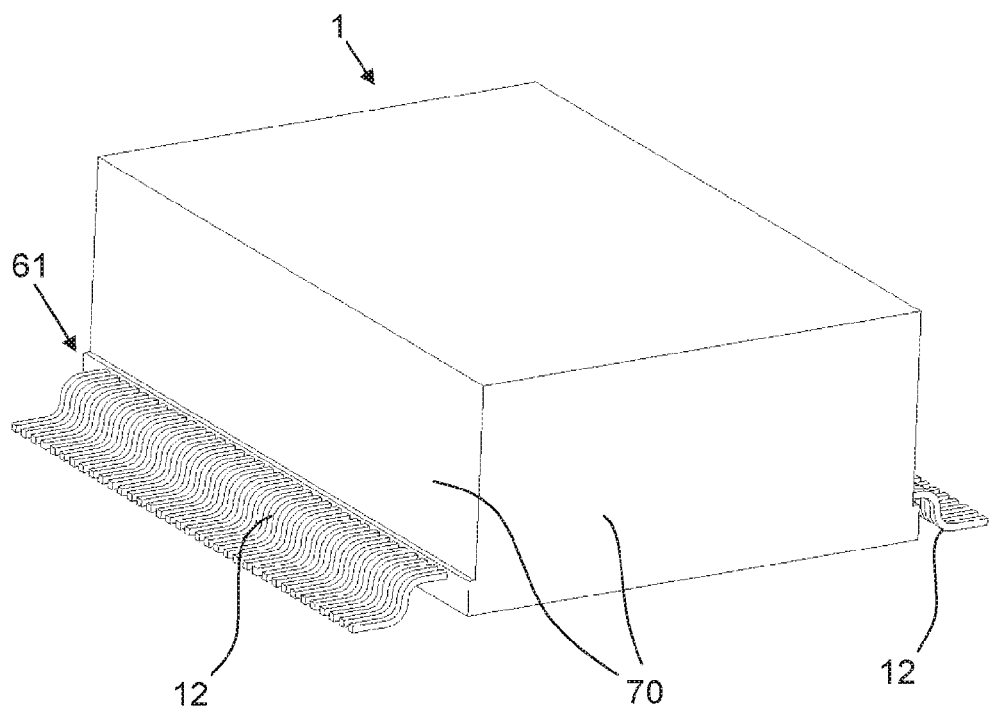
FIGS. 3a and 3b schematically show a perspective view of an exemplary 3D module obtained by the process according to the invention, comprising bent (FIG. 3a) or flat (FIG. 3b) external leads.
Figure 3B:
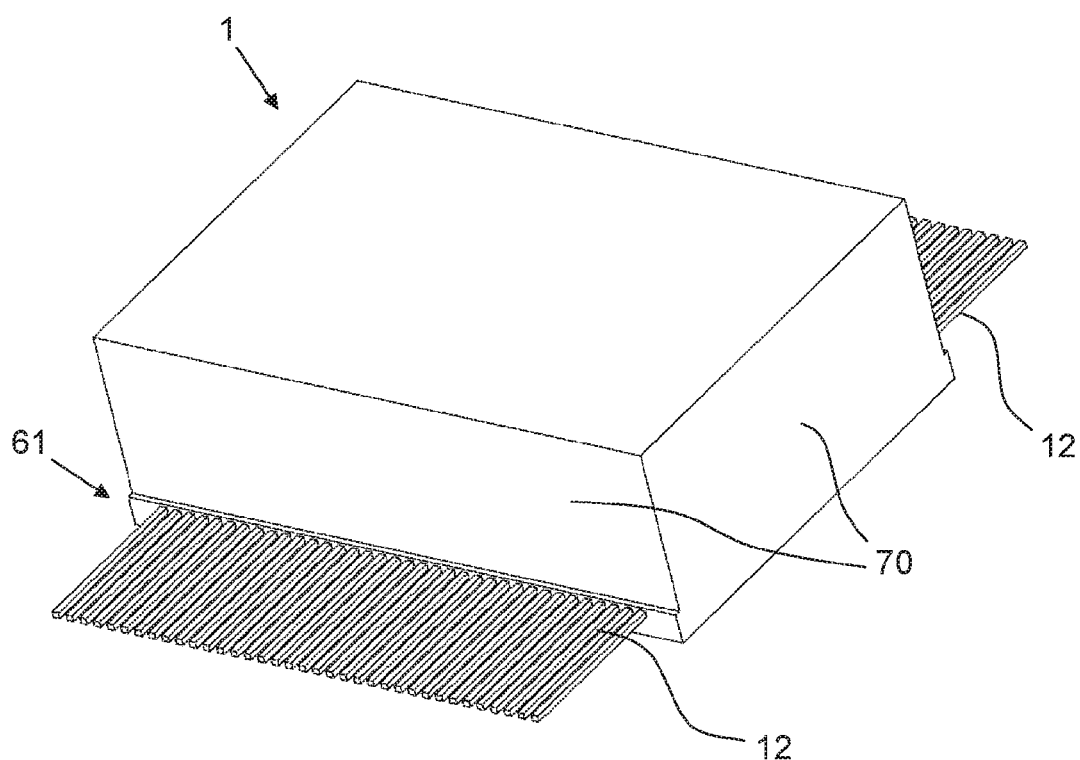

These external leads 12 may be bent as shown in FIG. 2i and FIG. 3a in which the three-dimensional module 1 (3D module) thus obtained is shown. FIG. 3b shows a 3D module the external leads 12 of which have been left flat.

Figure 4A:
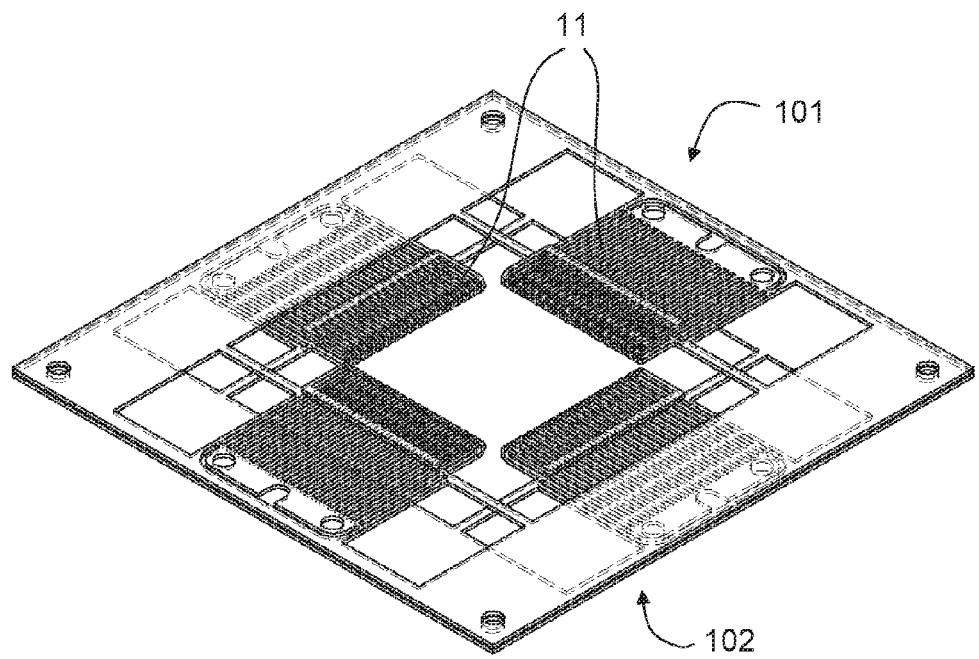
FIGS. 4a and 4b show in perspective a frame comprising two subframes placed perpendicularly one relative to the other (FIG. 4a) and, placed on this frame, a stack comprising 4 vertical interconnection faces (FIG. 4b)
Figure 5:
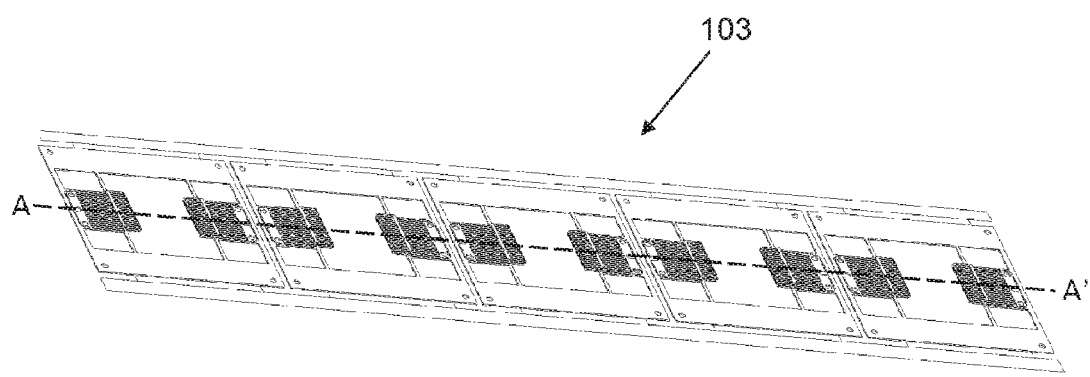
FIG. 5 shows in perspective a multiframe comprising 5 frames.

At the frame 100 level, the ends of the leads 10 may be fastened to one another as may be seen in FIGS. 1, 4a and 5 in order to facilitate the folding and to ensure the latter is uniform, whether it is a question of the first fold forming the internal portion or of the fold forming the gullwing bend in the external leads. But once the folding has been carried out they are unfastened from each other.

The system electrically interconnecting the 3D module with the exterior may not include a printed wiring board but only the leads 10 of the frame 100, as in the example in the figures. Optionally, the stack 40 includes such a printed wiring board on which the packages and/or other printed wiring boards are then stacked.

Of course the metallized faces 43 are etched to produce the vertical interconnection of the 3D module. This step may be carried out just after the metallisation, before the protective elements are removed. The 3D module may also be delivered to the customer without having been etched, if the latter prefers to carry out the etching himself; it will then be carried out after the removal of the protective elements, or even after the optional step of bending the external leads.

The figures show a 3D module with a stack of packages 42 comprising two vertical interconnection faces 43 (sections of the conductors of the stack are flush on two opposite faces) and therefore produced from a frame 100 including two corresponding groups of leads 10.

Figure 4B:
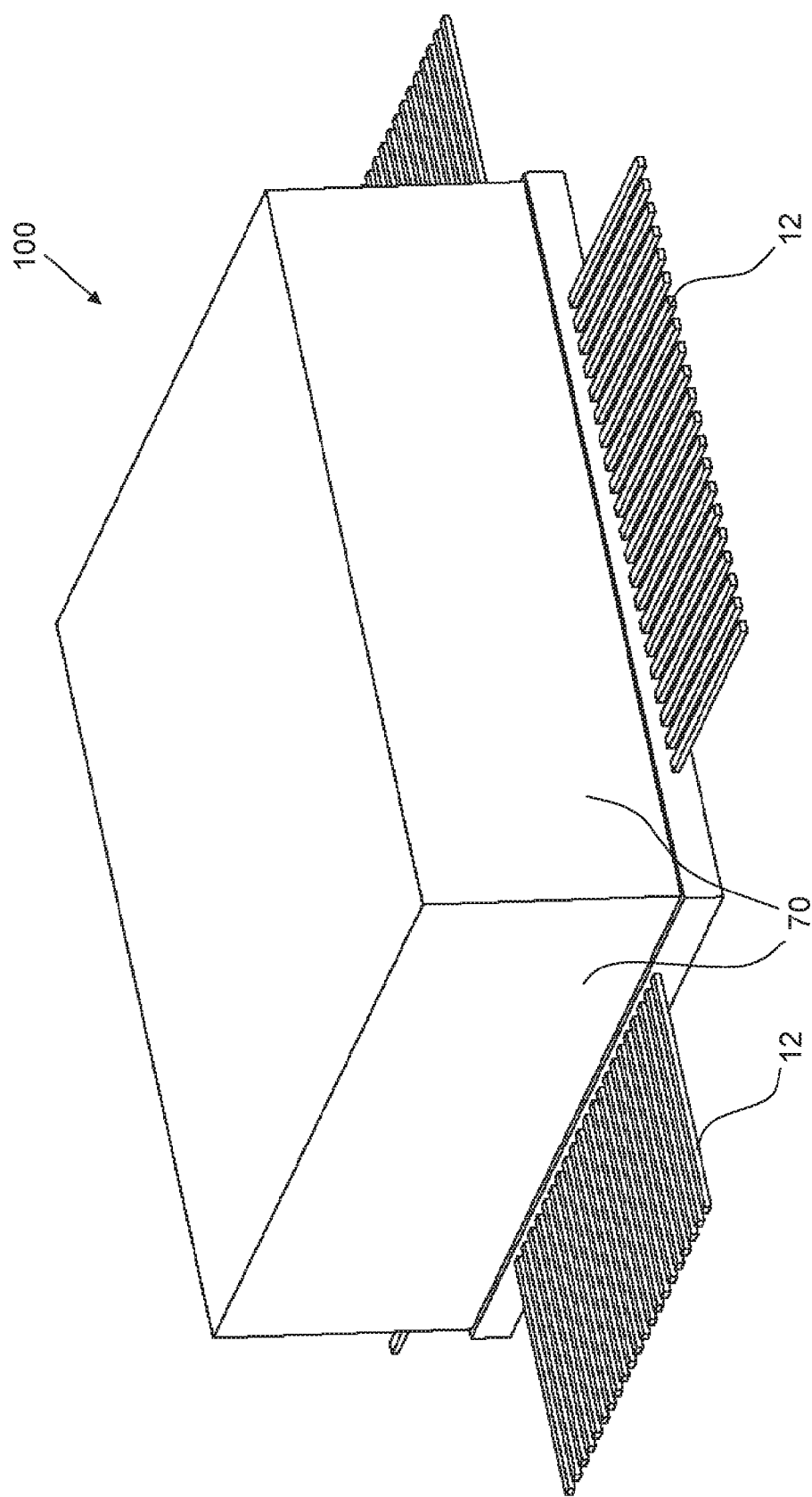

It is also possible to manufacture a 3D module having four vertical interconnection faces (sections of the conductors of the stack are flush on four opposite faces). Then, by way of lead frame 100, a frame including two subframes 101, 102 each including two groups of leads such as described above will then be used. These subframes are placed one on the other and perpendicular one relative to the other as may be seen in FIG. 4a, in which the leads are shown folded. The leads of the first subframe 101 are connected to two opposite faces of the stack 40, and those of the second subframe 102 are connected to the two other opposite faces of the stack 40 as shown in FIG. 4b.

The manufacture of a single 3D module comprising external connection leads has been described, but the steps of the process may be carried out collectively if a plurality of lead frames and as many stacks of packages are provided, each frame being intended for the interconnection of one stack such as described above, these frames furthermore being attached in the form of a multiframe 103. An example of such a multiframe 103 comprising 5 frames, ready to receive 5 stacks of packages and/or printed wiring boards is shown in FIG. 5.

Although the invention has been described with regard to particular embodiments, obviously it is in no way limited thereto and comprises any technique equivalent to the means described and their combinations if the latter do not depart from the scope of the invention.

The invention claimed is:

1. A process for manufacturing at least one 3D electronic module each comprising a stack in a Z direction of electronic packages and/or printed wiring boards, wherein the stack is placed on a system for electrically interconnecting the 3D module with the exterior comprising metal leads each having two ends, the process comprising the following steps:

starting with a lead frame that comprises metal leads each having two ends, one toward the interior of the frame and the other toward the exterior of the frame, folding by about 180° the interior ends of the leads in order to obtain what is referred to as an internal frame portion including the folded ends, which are intended to be moulded, the other portion, which is what is referred to as an external portion, including the unfolded exterior ends, the two ends of each lead being intended to emerge from the 3D module on a given face cut along Z;

depositing on the leads thus folded a metal coating compatible with subsequent steps of adhesive bonding and/or soldering of the external portion;

placing the external portion of the metallized frame between a lower protective element and an upper protective element while leaving the internal portion free, and placing the frame and the protective elements on a carrier;

placing each stack of packages and/or printed wiring boards equipped each with at least one electronic component and exterior tabs for electrically interconnecting packages and/or printed wiring boards, so as to superpose the exterior tabs on the internal portion;

moulding, in an epoxy resin, the stack, the exterior tabs and the internal portion and thereby partially covering the upper protective element;

cutting the resin along Z thereby leaving flush conductive sections of the exterior tabs and of the ends of the leads of the internal portion and thereby forming faces cut along Z, and removing the resin from the upper protective element;

metallizing the cut faces presenting the conductive sections;

removing the carrier; and removing the protective elements in order to expose the leads of the external portion.

2. The process for manufacturing at least one 3D electronic module according to claim 1, wherein the leads of the external portion are bent or flat.

3. The process for manufacturing at least one 3D electronic module according to claim 1, wherein the metallized cut faces are etched to produce a vertical interconnection.

4. The process for manufacturing at least one 3D electronic module according to claim 1, wherein a sealing element is placed between the protective elements during the placement of the external portion between these protective elements and that it is removed during the removal of the protective elements.

5. The process for manufacturing at least one 3D electronic module according to claim 1, wherein the exterior tabs of the packages and/or of the printed wiring boards are present on four sides and wherein the lead frame includes two subframes placed one on the other and perpendicular one relative to the other and each including leads, the leads of the first subframe being connected to two opposite faces of the stack, the leads of the second subframe being connected to the two other opposite faces of the stack.

6. The process for manufacturing a plurality of 3D electronic modules according to claim 1, wherein the frame is a multiframe.

7. A 3D electronic module including:
- a stack of packages and/or printed electronic wiring boards each equipped with at least one electronic component and exterior tabs for electrical interconnection of packages and/or printed wiring boards, this stack being moulded in a resin;
- in the direction of the stack, interconnection faces for interconnection of the packages and/or printed wiring boards, comprising conductive sections of the exterior tabs embedded in the resin; and
- assembled with the stack, a system for connecting the 3D module to the exterior, comprising metal leads each having two ends that emerge from a given face that is one of said interconnection faces with, between these two ends, a portion embedded in the resin.

* * * * *